US012581928B2

(12) United States Patent
Lee et al.

(10) Patent No.: US 12,581,928 B2
(45) Date of Patent: Mar. 17, 2026

(54) INTERCONNECT STRUCTURE WITH PROTECTIVE ETCH-STOP

(71) Applicant: Taiwan Semiconductor Manufacturing Company, Ltd., Hsin-Chu (TW)

(72) Inventors: Shao-Kuan Lee, Kaohsiung (TW); Hai-Ching Chen, Hsinchu (TW); Hsin-Yen Huang, New Taipei (TW); Shau-Lin Shue, Hsinchu (TW); Cheng-Chin Lee, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/403,044

(22) Filed: Jan. 3, 2024

(65) Prior Publication Data

US 2024/0136221 A1 Apr. 25, 2024

Related U.S. Application Data

(60) Continuation of application No. 17/829,611, filed on Jun. 1, 2022, now Pat. No. 11,901,221, which is a
(Continued)

(51) Int. Cl.
*H01L 21/768* (2006.01)
*H01L 23/532* (2006.01)
*H01L 23/535* (2006.01)

(52) U.S. Cl.
CPC .. *H01L 21/76829* (2013.01); *H01L 21/76805* (2013.01); *H01L 21/7682* (2013.01);
(Continued)

(58) Field of Classification Search
CPC ......... H01L 21/76829; H01L 21/76895; H01L 21/76805; H01L 21/7682; H01L 23/535; H01L 23/5329
See application file for complete search history.

(56) References Cited

U.S. PATENT DOCUMENTS 5,000,818 A * 3/1991 Thomas ............ H01L 21/76832
257/E21.586
10,651,122 B1 * 5/2020 Bao ................... H01L 21/76897
(Continued)

FOREIGN PATENT DOCUMENTS

CN 101425500 A 5/2009
CN 104752399 A 7/2015
CN 111129123 A 5/2020

OTHER PUBLICATIONS

Oh et al. "Formation and Characteristics of the Si-0-C—H Composite Films with Low Dielectric Constant Deposited by OJBTMSM-ICPCVD." IEEE International Conference on Plasma Science and 13th IEEE International Pulsed Power Conference. Digest of Papers (Cat. No. 01CH37251), published on Aug. 7, 2002.
(Continued)

*Primary Examiner* — Sue A Purvis
(74) *Attorney, Agent, or Firm* — Eschweiler & Potashnik, LLC

(57) ABSTRACT

An integrated chip includes a first metal line disposed over a substrate. A via is disposed directly over a top of the first metal line and the via has a first lower surface and a second lower surface above the first lower surface. A first dielectric structure is disposed laterally adjacent to the first metal line and along a sidewall of the first metal line. A first protective etch-stop structure is disposed directly over a top of the first dielectric structure and vertically separates the second lower surface of the via from the top of the first dielectric structure.

20 Claims, 10 Drawing Sheets

Related U.S. Application Data division of application No. 16/876,465, filed on May 18, 2020, now Pat. No. 11,355,390.

(52) U.S. Cl.
CPC .... *H01L 21/76895* (2013.01); *H01L 23/5329* (2013.01); *H01L 23/535* (2013.01)

(56) References Cited

U.S. PATENT DOCUMENTS

| | | | |
|---|---|---|---|
| 2009/0115061 A1 | 5/2009 | Chen | |
| 2010/0230815 A1* | 9/2010 | Tsao .................... | H01L 23/5226 257/E23.145 |
| 2015/0187696 A1 | 7/2015 | Tsai et al. | |
| 2016/0118334 A1 | 4/2016 | Tsai et al. | |
| 2017/0330790 A1 | 11/2017 | He et al. | |
| 2018/0226289 A1* | 8/2018 | Bielefeld .......... | H01L 21/76826 |
| 2019/0157388 A1 | 5/2019 | Ok et al. | |
| 2020/0095119 A1 | 3/2020 | Chang et al. | |
| 2020/0135676 A1 | 4/2020 | Kalnitsky et al. | |

OTHER PUBLICATIONS

Whelan et al. "Self-Assembled Monolayers: Surface Engineering & Characterization." Frontiers of Characterization and Metrology for Nanoelectronics. Published in 2017.

Lapedus, Mark. "Where Is Selective Deposition?" Semiconductor Engineering, published on Jun. 25, 2018.

Non-Final Office Action dated Oct. 6, 2021 for U.S. Appl. No. 16/876,465.

Notice of Allowance dated Feb. 4, 2022 for U.S. Appl. No. 16/876,465.

Notice of Allowance dated Oct. 4, 2023 for U.S. Appl. No. 17/829,611.

* cited by examiner

300

301y
301z
301x

400

700

800

900

1000

1100

1200

1300

1400

1500

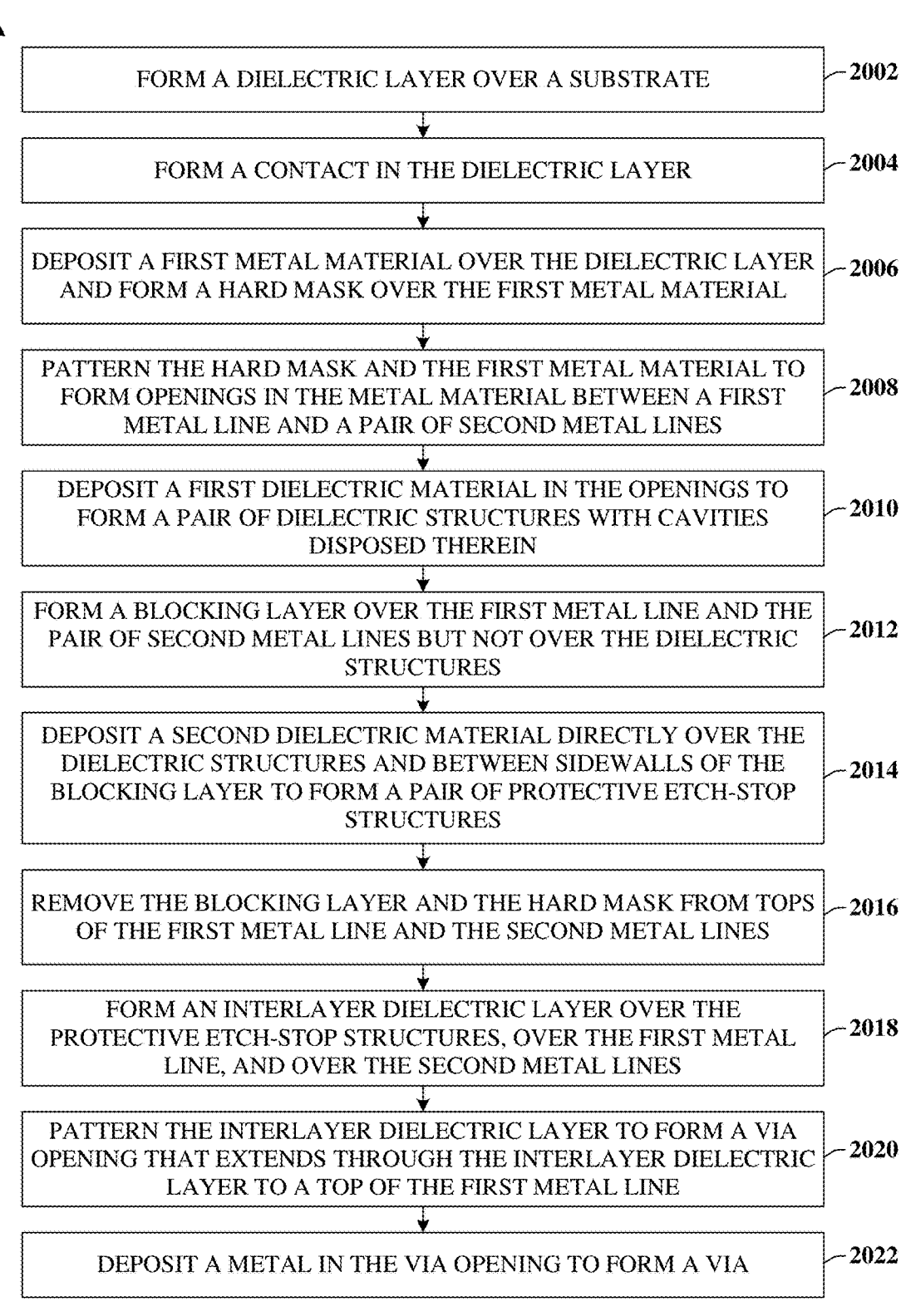

2000

| | |
|---|---|
| FORM A DIELECTRIC LAYER OVER A SUBSTRATE | 2002 |
| FORM A CONTACT IN THE DIELECTRIC LAYER | 2004 |
| DEPOSIT A FIRST METAL MATERIAL OVER THE DIELECTRIC LAYER AND FORM A HARD MASK OVER THE FIRST METAL MATERIAL | 2006 |
| PATTERN THE HARD MASK AND THE FIRST METAL MATERIAL TO FORM OPENINGS IN THE METAL MATERIAL BETWEEN A FIRST METAL LINE AND A PAIR OF SECOND METAL LINES | 2008 |
| DEPOSIT A FIRST DIELECTRIC MATERIAL IN THE OPENINGS TO FORM A PAIR OF DIELECTRIC STRUCTURES WITH CAVITIES DISPOSED THEREIN | 2010 |
| FORM A BLOCKING LAYER OVER THE FIRST METAL LINE AND THE PAIR OF SECOND METAL LINES BUT NOT OVER THE DIELECTRIC STRUCTURES | 2012 |
| DEPOSIT A SECOND DIELECTRIC MATERIAL DIRECTLY OVER THE DIELECTRIC STRUCTURES AND BETWEEN SIDEWALLS OF THE BLOCKING LAYER TO FORM A PAIR OF PROTECTIVE ETCH-STOP STRUCTURES | 2014 |
| REMOVE THE BLOCKING LAYER AND THE HARD MASK FROM TOPS OF THE FIRST METAL LINE AND THE SECOND METAL LINES | 2016 |
| FORM AN INTERLAYER DIELECTRIC LAYER OVER THE PROTECTIVE ETCH-STOP STRUCTURES, OVER THE FIRST METAL LINE, AND OVER THE SECOND METAL LINES | 2018 |
| PATTERN THE INTERLAYER DIELECTRIC LAYER TO FORM A VIA OPENING THAT EXTENDS THROUGH THE INTERLAYER DIELECTRIC LAYER TO A TOP OF THE FIRST METAL LINE | 2020 |
| DEPOSIT A METAL IN THE VIA OPENING TO FORM A VIA | 2022 |

Fig. 20

INTERCONNECT STRUCTURE WITH PROTECTIVE ETCH-STOP

REFERENCE TO RELATED APPLICATIONS

This application is a Continuation of U.S. application Ser. No. 17/829,611, filed on Jun. 1, 2022, which is a Divisional of U.S. application Ser. No. 16/876,465, filed on May 18, 2020 (now U.S. Pat. No. 11,355,390, issued on Jun. 7, 2022). The contents of the above-referenced patent applications are hereby incorporated by reference in their entirety.

BACKGROUND

Many modern day integrated chips contain millions of semiconductor devices, such as active semiconductor devices (e.g., transistors) and/or passive semiconductor devices (e.g., resistors, diodes, capacitors). The semiconductor devices are electrically interconnected by way of back-end-of-the-line (BEOL) metal interconnect layers that are formed above the semiconductor devices on an integrated chip. A typical integrated chip comprises a plurality of back-end-of-the-line metal interconnect layers including different sized metal wires vertically coupled together with metal contacts (i.e., vias).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 20 illustrates a flow diagram of some embodiments of a method of forming an interconnect structure comprising a pair of protective etch-stop structures.

DETAILED DESCRIPTION

Figure 1:
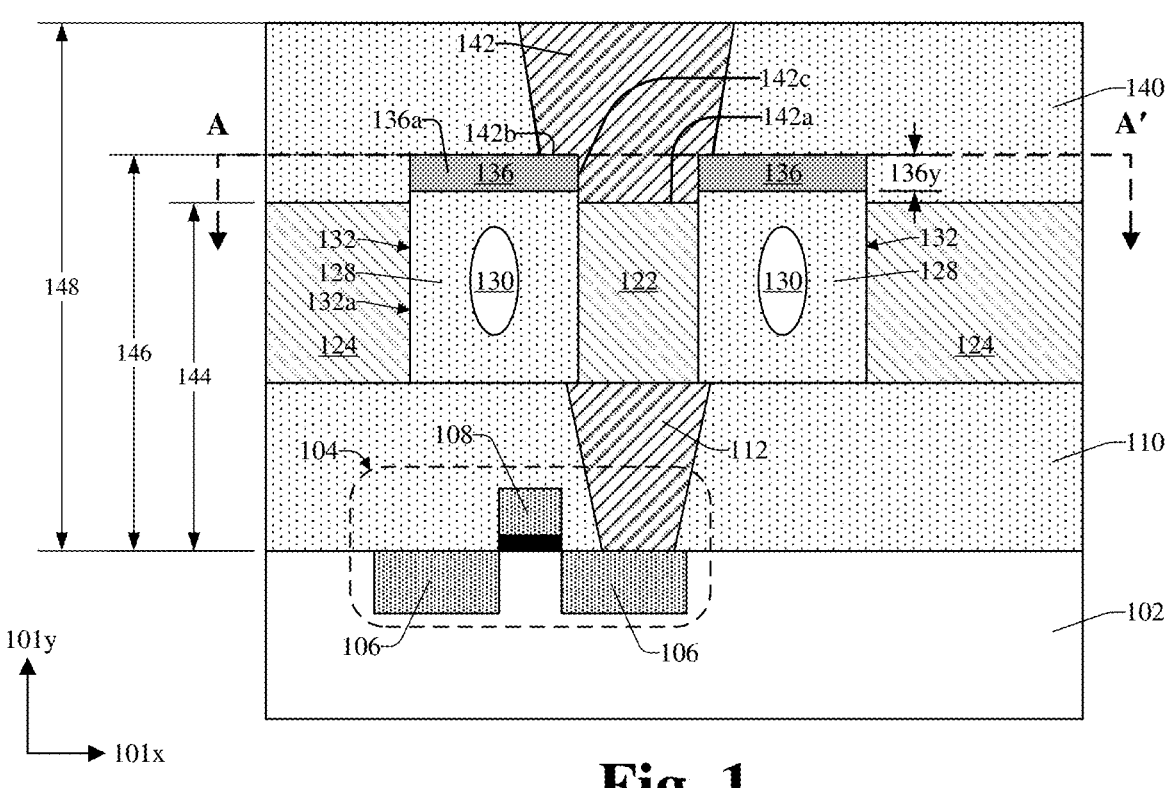
FIG. 1 illustrates a cross-sectional view of some embodiments of an integrated chip having an interconnect structure, the interconnect structure comprising a pair of protective etch-stop structures.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many integrated chips comprise an interconnect structure disposed over a substrate. For example, an interconnect structure may comprise a plurality of metal lines disposed over a substrate. Metal lines of the plurality of metal lines may be laterally spaced apart by a dielectric structure. The dielectric structure may comprise a first dielectric material and a cavity disposed within the first dielectric material. Further, the interconnect structure may comprise a via disposed over one of the plurality of metal lines and extending through a first interlayer dielectric (ILD) layer. The via may be electrically coupled to the one metal line and may be intended to be electrically isolated from neighboring metal lines of the plurality of metal lines.

A challenge with the example interconnect structure is that a misalignment may occur when forming the via and thus an undesirable leakage current or short may occur between the via and the neighboring metal lines, thereby reducing a reliability of the integrated chip. In particular, forming the via may comprise etching the ILD layer to form a via opening. However, if a misalignment of the via opening occurs, the etch may undesirably extend into the dielectric structure and may further extend to the cavity. Thus, upon depositing a metal into the via opening to form the via, the metal may extend nearer to a neighboring metal line than is desired, or may undesirably extend into the cavity. Thus, a distance between the via and the neighboring metal line may be reduced, thereby increasing a potential for a short or leakage current to occur between the via and the neighboring metal line. Further, a time dependent dielectric breakdown (TDDB) between the via and the neighboring lines may occur more quickly. As a result, the reliability of the integrated chip may be reduced.

Accordingly, various embodiments of the present disclosure are directed towards an integrated chip having an interconnect structure, the interconnect structure comprising a pair of protective etch-stop structures for reducing the potential for a misalignment in a via opening to negatively affect the reliability of the integrated chip. The interconnect structure may comprise a first metal line disposed over a semiconductor substrate and a pair of second metal lines laterally spaced apart from the first metal line on opposite sides of the first metal line. A via may extend through an interlayer dielectric (ILD) layer and may be disposed directly over the first metal line. The via may comprise a first lower surface disposed on an upper surface of the first metal line and a second lower surface above the first lower surface. The via may be electrically connected to the first metal line and electrically isolated from the pair of second metal lines. A pair of dielectric structures may be disposed on opposite sides of the first metal line and may laterally separate the first metal line from the pair of second metal lines. The pair of dielectric structures may comprise a first dielectric material and may comprise cavities disposed therein. The pair of protective etch-stop structures may be disposed directly over tops of the dielectric structures and may comprise a second dielectric material different from the first dielectric material. The pair of protective etch-stop structures may vertically separate the second lower surface of the via from one of the dielectric structures.

By disposing the protective etch-stop structures directly over the tops of the dielectric structures, the dielectric structures may be protected from the via, thereby isolating the via from the second metal lines. In particular, when forming the via opening, the ILD layer may be etched with high selectivity relative to the second dielectric material. Thus, the via opening etch, even if misaligned, may extend through the ILD layer to a top of the first metal line but not through the protective etch-stop structures. In turn, the via opening (and thus the via), even if misaligned, may not extend into the dielectric structures, thereby preventing a distance between the via and the second metal lines from being reduced. Thus, a potential for a short or an undesirable leakage current to occur between the via and the electrically isolated second metal lines may be reduced. As a result, the overall reliability of the integrated chip may be improved.

FIG. 1 illustrates a cross-sectional view of some embodiments of an integrated chip 100 having an interconnect structure, the interconnect structure comprising a pair of protective etch-stop structures 136. The cross-sectional view of FIG. 1 may be taken across line A-A' of FIG. 2. The integrated chip 100 may comprise a transistor device 104 disposed in a substrate 102. A dielectric layer 110 may be formed over the substrate 102 and a contact 112 may extend through the dielectric layer 110 from a top of the dielectric layer 110 to the transistor device 104.

A first metal line 122 may be disposed over the substrate 102 at a first height 144. The first metal line may also be disposed directly over the contact 112. A pair of second metal lines 124 may be disposed over the substrate at the first height 144 and may be laterally separated from the first metal line 122 by a pair of dielectric structures 132. The pair of dielectric structures 132 may be laterally adjacent to the first metal line 122 and the pair of second metal lines 124. Both of the pair of dielectric structures 132 may comprise a first dielectric material 128 and a cavity 130 disposed within the first dielectric material 128. Further, the pair of second metal lines 124 may be electrically isolated from the first metal line 122.

The integrated chip 100 may further comprise a via 142 that may be disposed over the substrate 102 at a second height 148 that is greater than the first height 144. The via 142 may be disposed directly over the first metal line 122 and may extend through an interlayer dielectric (ILD) layer 140 to a top of the first metal line 122. The via 142 may comprise a first lower surface 142a and a second lower surface 142b above the first lower surface 142a. The second lower surface 142b may be laterally offset from the first lower surface 142a. In addition, the first lower surface 142a may be connected to the second lower surface 142b by a first sidewall 142c of the via 142. The first lower surface 142a may be disposed directly over a top of the first metal line 122 and may contact the first metal line 122. Further, the via 142 may be electrically coupled to the first metal line 122 and may be electrically isolated from the pair of second metal lines 124.

In some embodiments, the pair of protective etch-stop structures 136 may be disposed over the substrate 102 at a third height 146 that is greater than the first height 144 and less than the second height 148. The protective etch-stop structures 136 may be disposed on tops of the pair of dielectric structures 132 and may extend between outer sidewalls of the pair of dielectric structures 132. The protective etch-stop structures 136 may comprise a second dielectric material different from the first dielectric material 128. The first sidewall 142c of the via 142 may be disposed along a sidewall of one of the protective etch-stop structures 136 and may further be disposed along a sidewall of the dielectric structure 132. Further, the second lower surface 142b of the via 142 may be vertically separated from a first dielectric structure 132a of the pair of dielectric structures 132 by a first protective etch-stop structure 136a of the pair of protective etch-stop structures 136. In addition, the first lower surface 142a of the via 142 may extend between opposing sidewalls of the dielectric structures 132.

In some embodiments, bottoms of the protective etch-stop structures 136 may be disposed above a top of the first metal line 122 and above the first lower surface 142a of the via 142. However, in some alternative embodiments (not shown), the bottoms of the protective etch-stop structures 136 may be vertically aligned with the top of the first metal line 122.

By disposing the pair of protective etch-stop structures 136 directly over the tops of the dielectric structures 132, the dielectric structures 132 may be protected (i.e., separated) from the via 142, thereby maintaining the electrical isolation of the via 142 from the second metal lines 124. In particular, if a misalignment occurs when forming the via 142, the protective etch-stop structures 136 may separate the underlying dielectric structures 132 from the via 142, thereby preventing the via 142 from extending into the cavities 130 within the dielectric structures 132 and toward the second metal lines 124. As a result, undesired shorts or leakage currents between the via 142 and the second metal lines 124 may be prevented, thereby improving a reliability of the integrated chip 100.

In some embodiments, the substrate 102 may comprise silicon, some other semiconductor material, or any combination of the foregoing. The transistor device 104 may comprise a pair of source/drain regions 106 and a gate 108. The transistor device 104 may be or comprise a metal-oxide-semiconductor field-effect transistor (MOSFET), a junction field effect transistor (JFET), a bipolar junction transistor (BJT), some other device, or the like.

In some embodiments, the dielectric layer 110 may comprise silicon dioxide, silicon nitride, some low-k dielectric, some other dielectric, or any combination of the foregoing. The contact 112 may comprise tungsten, titanium, tantalum, aluminum, copper, some other metal material, or any combination of the foregoing. Although the contact 112 is a described as a contact, it will be appreciated that the contact 112 may alternatively be a via or some other form of interconnect.

The cavities 130 may comprise a gas or combination of gasses, such as, for example, air, oxygen, nitrogen, argon, carbon dioxide, or the like. The cavities 130 may be disposed below tops of the first dielectric material 128 by at least 1 nanometer. The cavities 130 may reduce an overall dielectric constant of the dielectric structures 132, thereby reducing a capacitance between the first metal line 122 and the pair of second metal lines 124. As a result, a resistive-capacitive (RC) delay of the integrated chip 100 may be reduced.

In some embodiments, the first metal line 122 and the pair of second metal lines 124 may comprise copper, cobalt, tungsten, aluminum, titanium, tantalum, some other metal, or any combination of the foregoing. The first dielectric material 128 may be or comprise silicon dioxide, silicon nitride, silicon oxycarbide, some Si—O—C—H composite film, some other low-k dielectric, or any combination of the foregoing.

The via 142 may comprise copper, cobalt, tungsten, aluminum, titanium, tantalum, some other metal, or any combination of the foregoing. The ILD layer 140 may comprise silicon dioxide, silicon nitride, silicon oxycarbide, some Si—O—C—H composite film, some other low-k dielectric, or any combination of the foregoing.

Although items 122, 124, and 142 are described as the first metal line 122, the pair of second metal lines 124, and the via 142, it will be appreciated that items 122, 124, and 142 may alternatively be some other metal features and are not limited to metal lines and/or vias.

The second dielectric material, of which the protective etch-stop structures 136 are comprised, may comprise silicon dioxide, silicon nitride, aluminum oxide, zirconium oxide, hafnium oxide, yttrium oxide, some other metal oxide, aluminum nitride, zirconium nitride, hafnium nitride, yttrium nitride, some other metal nitride, some other dielectric, or any combination of the foregoing. The protective etch-stop structures 136 may have a thickness 136$y$ extending along a y-axis 101$y$ of about 0.1 nanometers to 10 nanometers.

Figure 2:
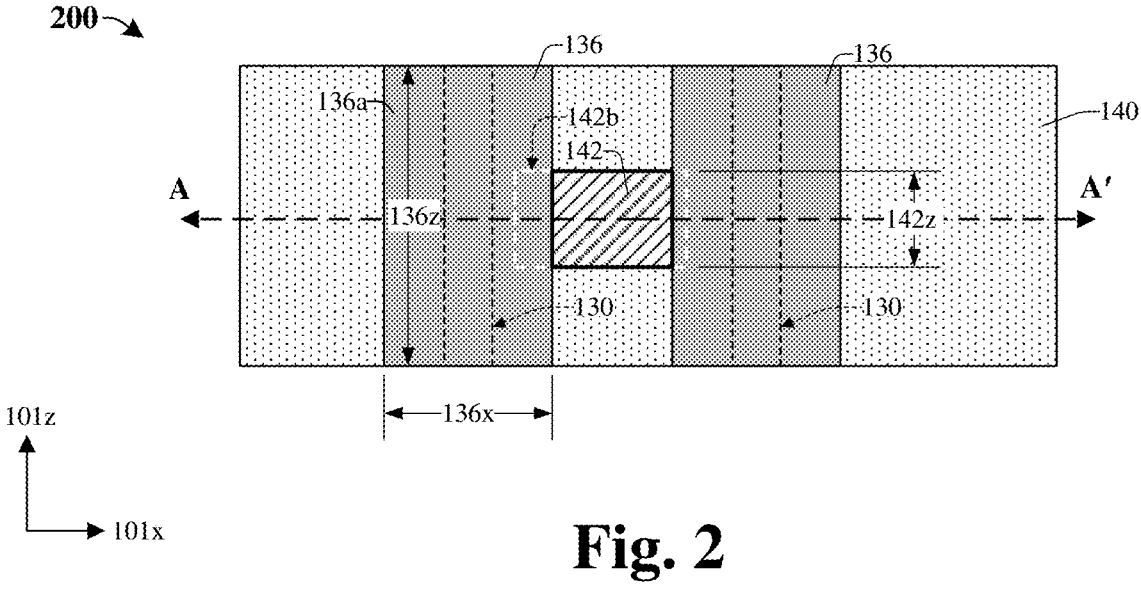
FIG. 2 illustrates a top layout view of some embodiments of an integrated chip having the interconnect structure of FIG. 1.

FIG. 2 illustrates a top layout view of some embodiments of an integrated chip 200 having the interconnect structure of FIG. 1. The pair of dielectric structures 132 and the pair of protective etch-stop structures 136 may have lengths that extend along a z-axis 101$z$ (i.e., into the page in FIG. 1) and widths that extend along an x-axis 101$x$. A length 136$z$ of the pair of protective etch-stop structures 136 may be greater than a length 142$z$ of the via 142. In particular, the length 136$z$ of the pair of protective etch-stop structures 136 may be equal to a length (not labeled) of the first metal line 122. In addition, a width 136$x$ of a first protective etch-stop structure 136$a$ of the pair of protective etch-stop structures 136 may be equal to a width (not labeled) of the underlying first dielectric structure 132$a$ of the pair of dielectric structures 132 such that the first dielectric material 128 is vertically separated from the via 142 by the first protective etch-stop structure 136$a$. The width 136$x$ of the first protective etch-stop structure 136$a$ of the pair of protective etch-stop structures 136 may depend on the minimum pitch of the integrated chip.

Figure 3:
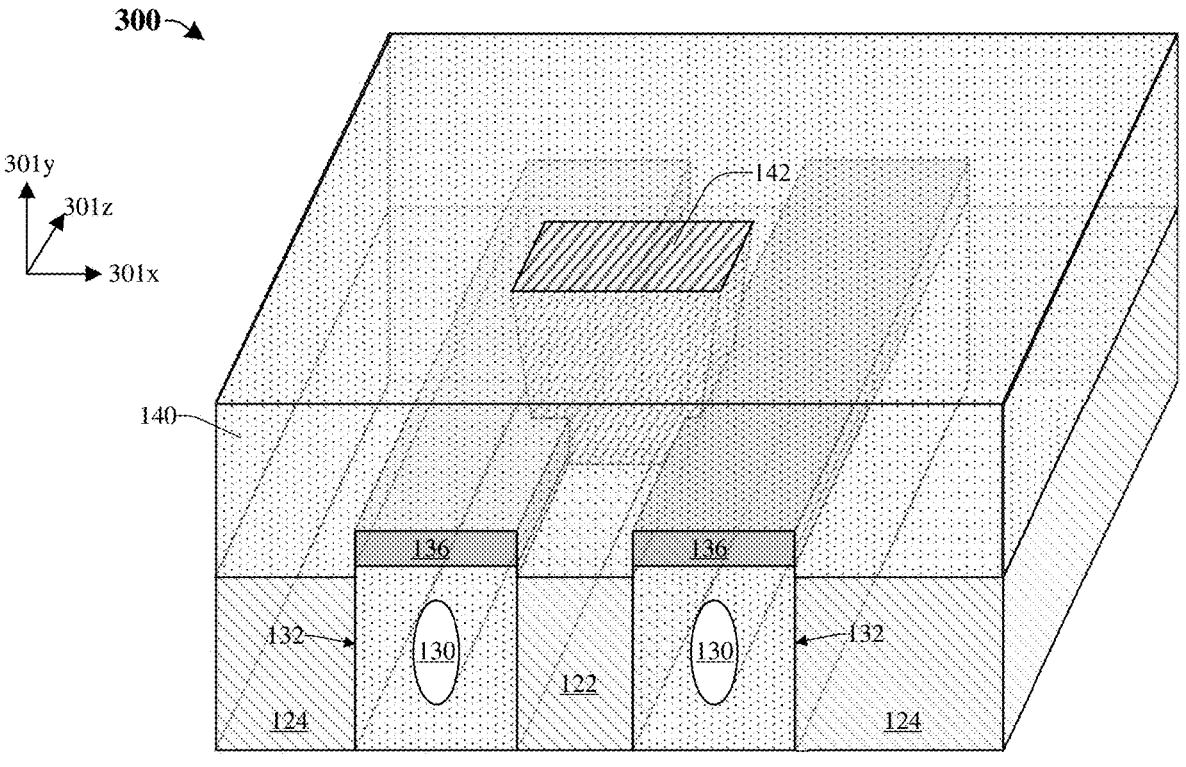
FIG. 3 illustrates a three-dimensional view of some embodiments of an integrated chip having the interconnect structure of FIG. 1.

FIG. 3 illustrates a three-dimensional view of some embodiments of an integrated chip 300 having an interconnect structure, the interconnect structure comprising a pair of protective etch-stop structures 136. As illustrated in FIG. 3, the dielectric structures 132 may extend along the z-axis 301$z$ between the first metal line 122 and the pair of second metal lines 124. In addition, the pair of protective etch-stop structures 136 may extend along the z-axis 301$z$ directly over the dielectric structures 132 and through the ILD layer 140. Further, the via 142 may extend along the y-axis 301$y$ through the ILD layer 140 to the top of the first metal line 122 and to tops of the protective etch-stop structures 136. Furthermore, the via 142 may extend along an x-axis 301$x$ between the protective etch-stop structures 136.

Figure 4:
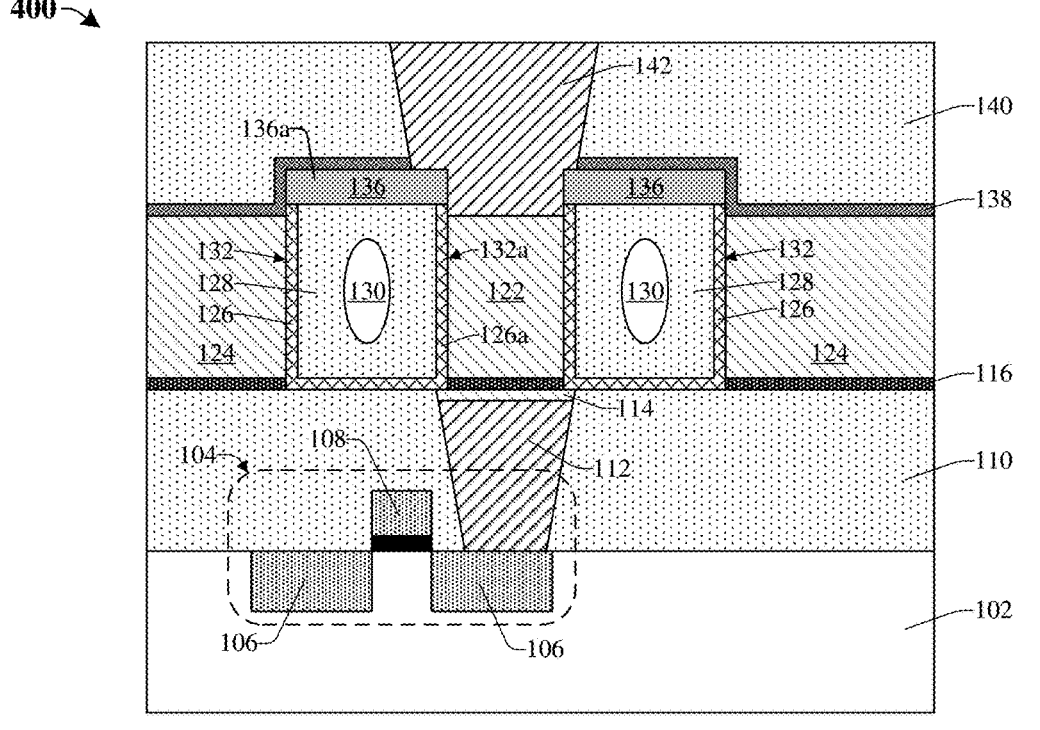
FIGS. 4-6 illustrate cross-sectional views of some additional embodiments of an integrated chip having an interconnect structure, the interconnect structure comprising a pair of protective etch-stop structures.

FIG. 4 illustrates a cross-sectional view of some additional embodiments of an integrated chip 400 having an interconnect structure, the interconnect structure comprising a pair of protective etch-stop structures 136. A capping layer 114 may be disposed within the dielectric layer 110 and directly over the contact 112. The capping layer 114 may comprise copper or the like. A glue layer 116 may be disposed on an upper surface of the dielectric layer 110 between the first metal line 122 and the capping layer 114 and/or between the pair of second metal lines 124 and the dielectric layer 110. The glue layer 116 may comprise a nitride film such as, for example, titanium nitride, tantalum nitride, or the like.

An etch-stop layer 138 may be disposed on tops of the pair of protective etch-stop structures 136 and on tops of the pair of second metal lines 124 such that the etch-stop layer 138 may vertically separate the pair of protective etch-stop structures 136 and the pair of second metal lines 124 from the ILD layer 140. The etch-stop layer 138 may also be disposed along sidewalls of the via 142 and/or sidewalls of the protective etch-stop structures 136. The etch-stop layer 138 may comprise a third dielectric material different from the second dielectric material. For example, the etch-stop layer 138 may comprise silicon dioxide, silicon nitride, silicon carbide, aluminum nitride, aluminum oxide, silicon oxycarbide, or the like.

In some embodiments, the pair of dielectric structures 132 may further comprise a barrier layer 126 disposed along sidewalls and lower surfaces of the first dielectric material 128. The barrier layer 126 may comprise aluminum nitride, silicon oxycarbide, or the like. The pair of protective etch-stop structures 136 may laterally extend along an x-axis 101$x$ between outermost sidewalls of their associated barrier layers 126 such that bottom surfaces of the protective etch-stop structures 136 may be disposed on top surfaces of the associated barrier layers 126, as illustrated in FIG. 4. For example, the first protective etch-stop structure 136$a$ of the pair of protective etch-stop structures 136 may have a width that is equal to a width between outermost sidewalls of a first segment 126$a$ of the barrier layer 126.

Figure 5:
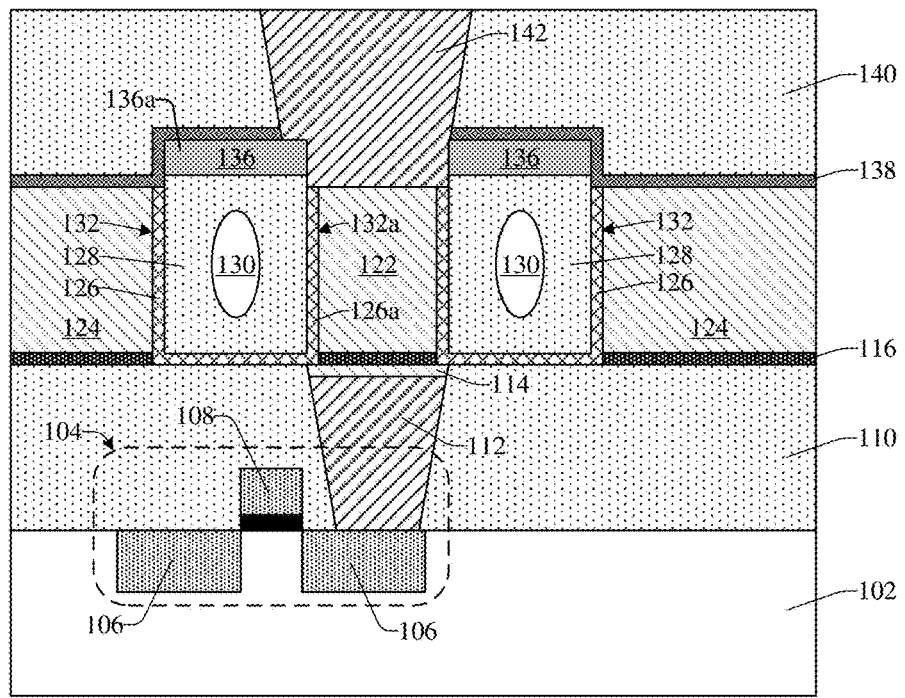

FIG. 5 illustrates a cross-sectional view of some additional embodiments of an integrated chip 500 having an interconnect structure, the interconnect structure comprising a pair of protective etch-stop structures 136. In some embodiments, the pair of protective etch-stop structures 136 may extend between inner sidewalls of their associated barrier layers 126 such that bottom surfaces of the etch-stop layer 138 and/or a bottom surface of the via 142 may be disposed on top surfaces of the barrier layer 126. For example, the first protective etch-stop structure 136$a$ of the pair of protective etch-stop structures 136 may have a width that is less than a width between outermost sidewalls of a first segment 126$a$ of the barrier layer 126 and equal to a width between innermost sidewalls of the first segment 126$a$ of the barrier layer 126. Moreover, the first protective etch-stop structure 136$a$ of the pair of protective etch-stop structures 136 may have a width that is less than a width of the underlying first dielectric structure 132$a$ of the pair of dielectric structures 132.

Figure 6:
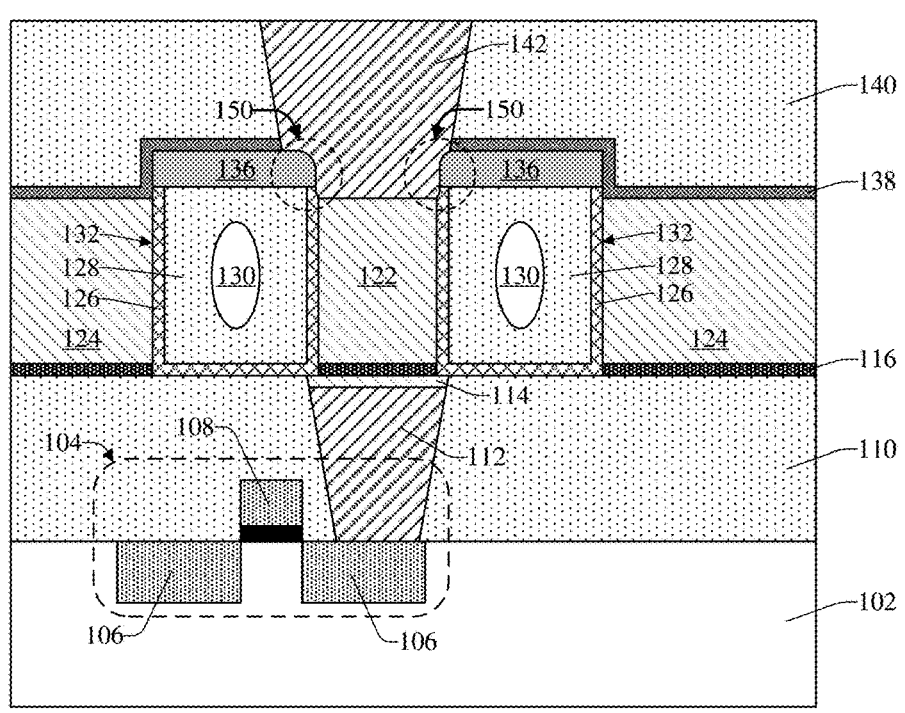

FIG. 6 illustrates a cross-sectional view of some additional embodiments of an integrated chip 600 having an interconnect structure, the interconnect structure comprising a pair of protective etch-stop structures 136. In some embodiments, the pair of protective etch-stop structures 136 may comprise rounded or curved sidewalls and/or upper surfaces, as seen in via-etch regions 150 of FIG. 6. Further, the barrier layer 126 may also comprise curved or thinned sidewalls at locations where the barrier layer 126 is disposed along sidewalls of the via 142. The shapes of any of the aforementioned sidewalls and/or surfaces may be the result of an etch that forms an opening in which the via 142 is to be formed. See, for example, FIG. 18. The etch may remove part of the ILD layer 140 where the via 142 is disposed, but also may remove portions of the protective etch-stop structures 136 and portions of the barrier layer 126, as seen in the via-etch regions 150 of FIG. 6. However, due to a relatively low etch rate of the protective etch-stop structures 136 compared to an etch rate of the ILD layer 140 during the via opening etch, removal of the protective etch-stop structures 136 may be minimal. Thus, the protective etch-stop structures 136 may protect the underlying first dielectric material 128 from the etch. Although FIG. 6 illustrates both of the protective etch-stop structures 136 having rounded or curved sidewalls and/or upper surfaces, it will be appreciated that in some other embodiments, only one of the protective etch-stop structures 136 may have rounded or curved sidewalls and/or upper surfaces while the other protective etch-stop structure 136 may have flat sidewalls and/or upper surfaces.

FIGS. 7-19 illustrate cross-sectional views 700-1900 of some embodiments of a method of forming an integrated chip having an interconnect structure, the interconnect structure comprising a pair of protective etch-stop structures. Although FIGS. 7-19 are described in relation to a method, it will be appreciated that the structures disclosed in FIGS. 7-19 are not limited to such a method, but instead may stand alone as structures independent of the method.

Figure 7:
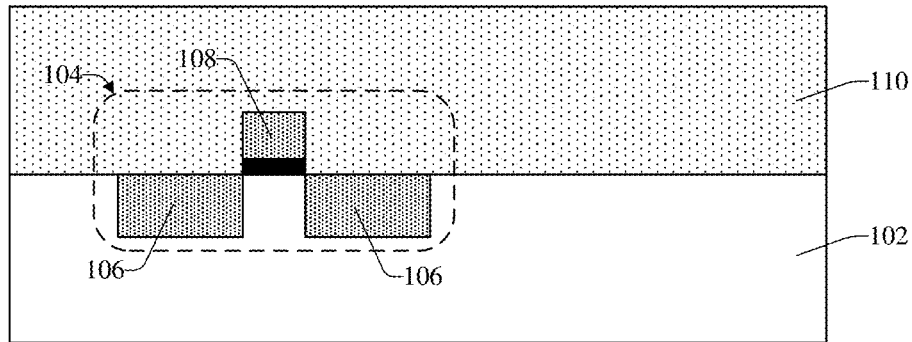
FIGS. 7-19 illustrate cross-sectional views of some embodiments of a method of forming an integrated chip having an interconnect structure, the interconnect structure comprising a pair of protective etch-stop structures.

As shown in cross-sectional view 700 of FIG. 7, a transistor device 104 may be formed in a substrate 102 and a dielectric layer 110 may be formed over the substrate 102.

Figure 8:
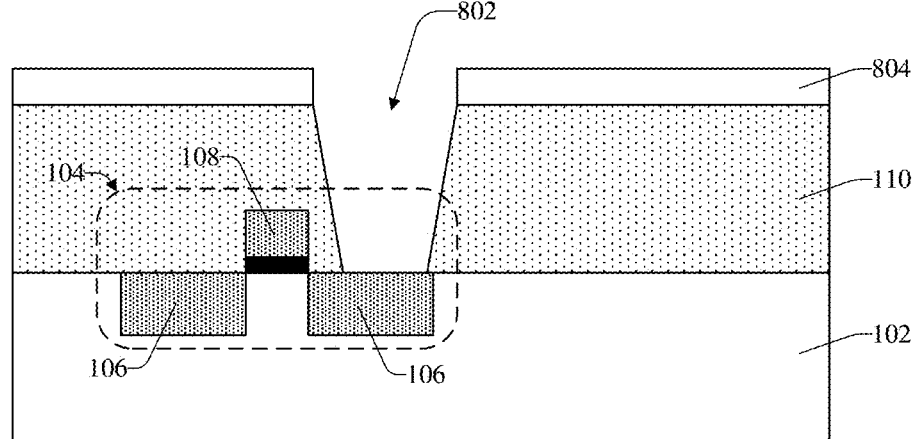

As shown in cross-sectional view 800 of FIG. 8, a photoresist mask 804 may be formed over the dielectric layer 110 and the dielectric layer 110 may be patterned with the photoresist mask 804 in place to form a contact opening 802. The patterning may comprise a wet etching process or a dry etching process. The photoresist mask 804 may be removed after the etching process.

Figure 9:
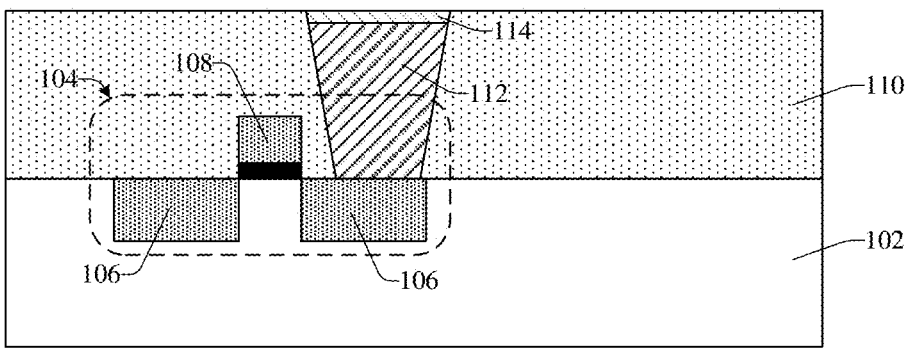

As shown in cross-sectional view 900 of FIG. 9, a contact 112 may be formed in the contact opening 802 and a capping layer 114 may be formed in the contact opening 802 directly over the contact 112. The contact 112 and the capping layer 114 may be formed by depositing one or more metal materials in the contact opening 802 by one or more of a sputtering process, an electroplating process, another suitable deposition process, or any combination of the foregoing. For example, the contact 112 may comprise tungsten, titanium, cobalt, or the like, and the capping layer 114 may comprise copper, tungsten, titanium or the like. The capping layer 114 may comprise the same or different materials as the contact 112.

Figure 10:
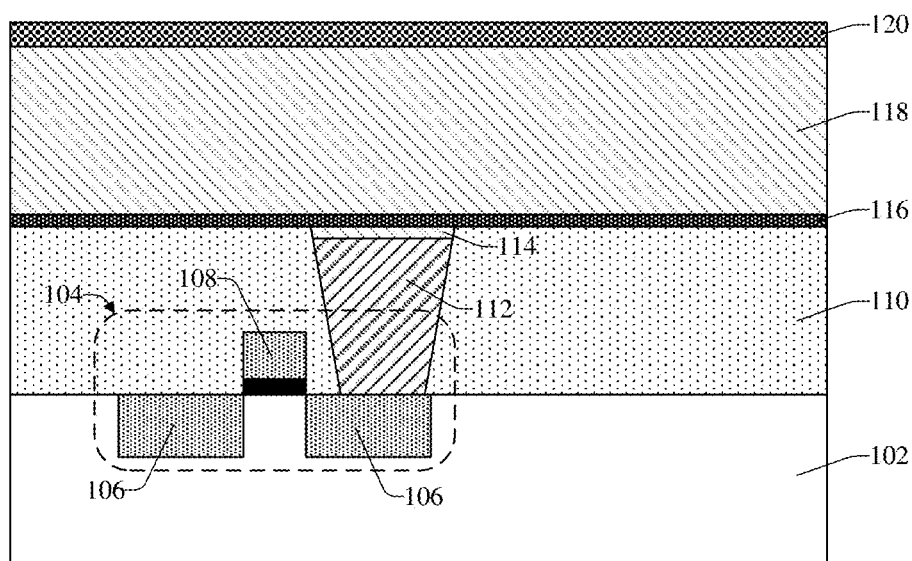

As shown in cross-sectional view 1000 of FIG. 10, a glue layer 116 may be formed over the dielectric layer 110 and over the capping layer 114 by depositing a nitride film or some other dielectric by chemical vapor deposition (CVD), physical vapor deposition (PVD), atomic layer deposition (ALD), a spin-on process, or the like. For example, the glue layer 116 may comprise titanium nitride or the like. A first metal material 118 may be deposited on the glue layer 116 by a sputtering process, an electroplating process, another suitable deposition process, or any combination of the foregoing. The first metal material 118 may comprise, for example, copper, titanium, tungsten, or the like. In addition, a hard mask 120 may be formed over the first metal material 118 by depositing a dielectric material by CVD, PVD, ALD, a spin-on process, or the like. The hard mask 120 may comprise, for example, titanium nitride, some other metal nitride, or the like.

Figure 11:
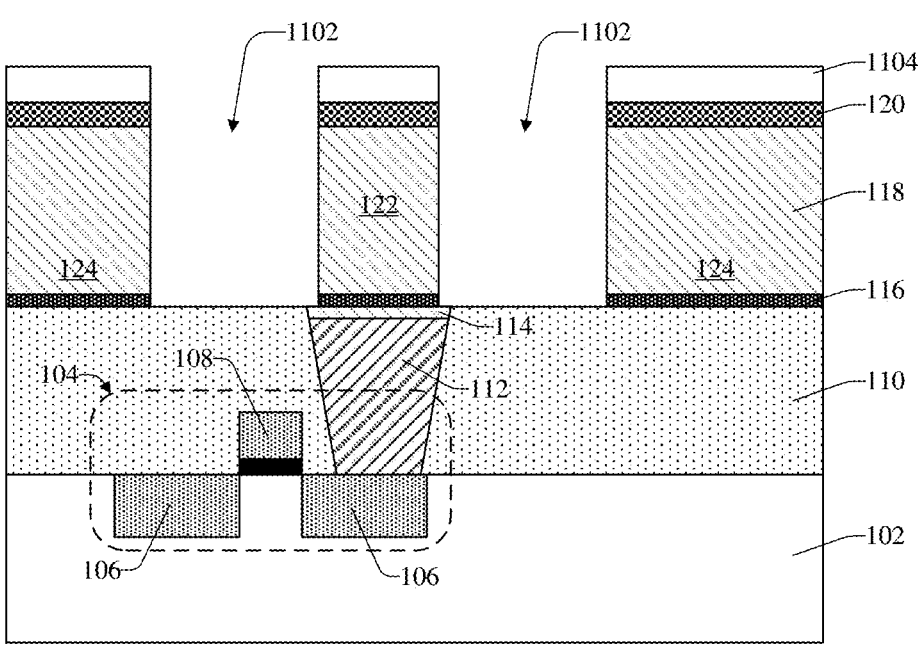

As shown in cross-sectional view 1100 of FIG. 11, a photoresist mask 1104 may be formed over the hard mask 120. The hard mask 120, the first metal material 118, and the glue layer 116 may then patterned to form openings 1102 and thus to form a first metal line 122 and a pair of second metal lines 124. The photoresist mask 1104 may be in place during the patterning of the hard mask 120 and may not be in place during the patterning of the first metal material 118 and/or the glue layer 116. The patterning may comprise a wet etching process or a dry etching process.

Figure 12:
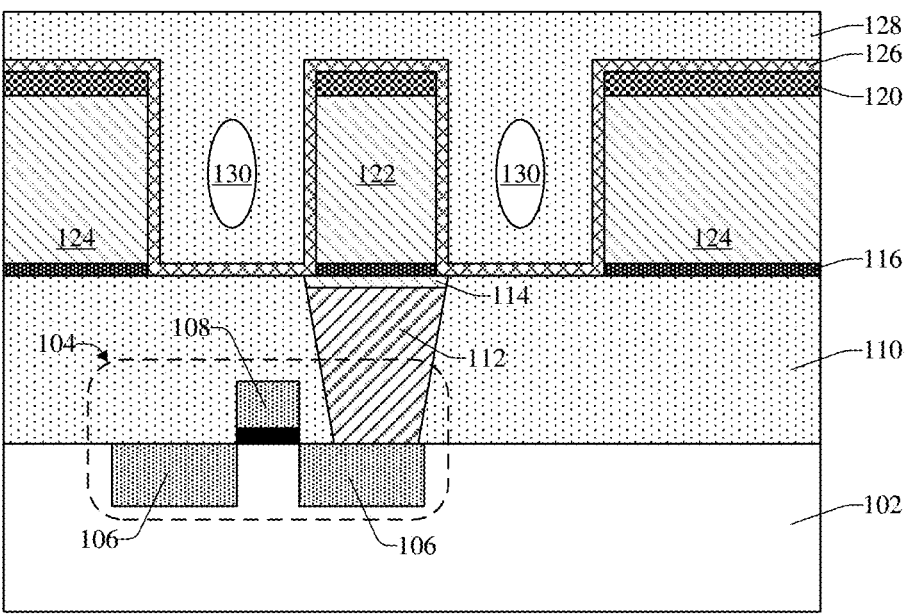

As shown in cross-sectional view 1200 of FIG. 12, a barrier layer 126 may be conformally formed over the hard mask 120 and in the openings 1102 such that the barrier layer 126 may extend along sidewalls of the first metal line 122 and the pair of second metal lines 124 and further along a top of the dielectric layer 110. The barrier layer 126 may comprise, for example, aluminum nitride, silicon oxycarbide, or the like. A first dielectric material 128 may then be deposited in the openings 1102 over the barrier layer 126 by plasma-enhanced chemical vapor deposition (PECVD), PVD, CVD, ALD, a spin-on process, or the like. The deposition of the first dielectric material 128 may be performed such that cavities 130 may be formed in the first dielectric material 128. For example, when depositing the first dielectric material 128 in the openings 1102, the first dielectric material 128 may not fill the entire space within the openings 1102, thus resulting in cavities 130 forming within the first dielectric material 128. The first dielectric material 128 may, for example, comprise silicon dioxide, silicon oxycarbide, some Si—O—C—H composite film, or the like. The cavities 130 may comprise one or more gases such as, for example, air or the like.

Figure 13:
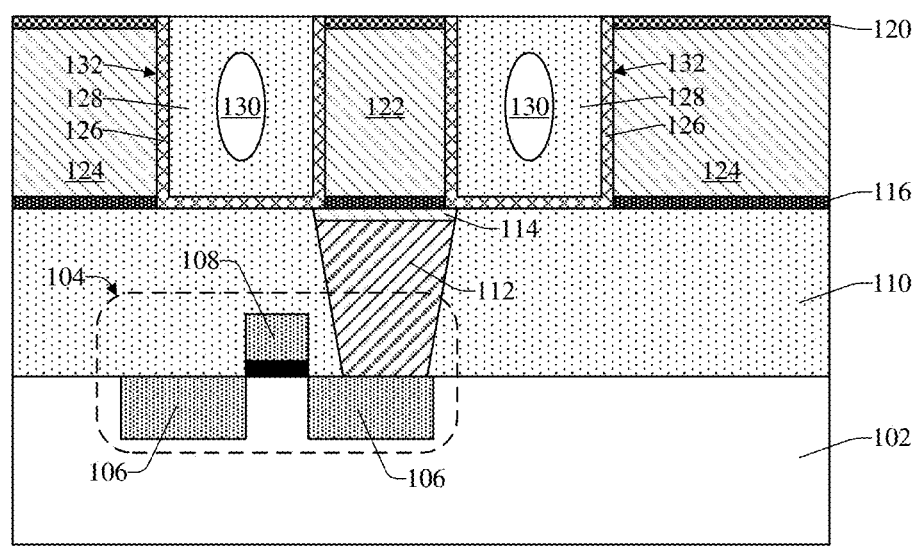

As shown in cross-sectional view 1300 of FIG. 13, a polishing process may be performed on a top surface of the first dielectric material 128. The polishing may remove the first dielectric material 128 and the barrier layer 126 from a top of the hard mask 120. The polishing may also remove part of the hard mask 120 (i.e., the polishing may thin the hard mask 120). The polishing may comprise a chemical mechanical polish (CMP) or the like. As a result, a pair of dielectric structures 132 comprising the barrier layer 126, the first dielectric material 128, and the cavities 130 may be formed on opposite sides of the first metal line 122 between the first metal line 122 and the pair of second metal lines 124.

Figure 14:
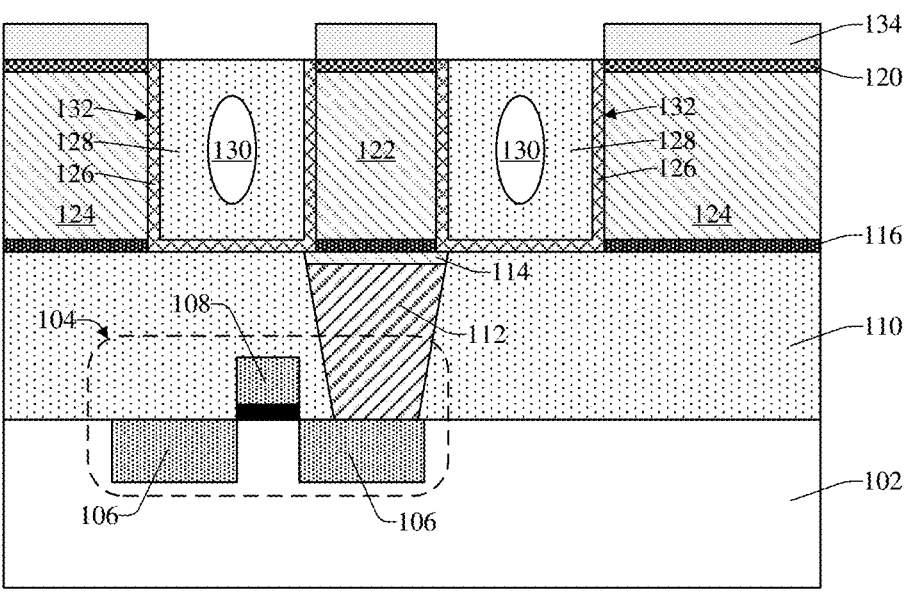

As shown in cross-sectional view 1400 of FIG. 14, a blocking layer 134 may be formed over the hard mask 120. The blocking layer 134 may comprise self-assembled monolayers (SAMs) such as, for example, polystyrene, phosphonic acids, thiols, benzotriazole, some Si—O—C—H monolayer, or the like. In particular, the SAMs may be selectively formed on top of the hard mask 120 but not on tops of the dielectric structures 132. For example, the SAMs may be formed by CVD, ALD, a spin-on process, a spray on process, an electro-less deposition process, or the like. In some embodiments (not shown), the blocking layer 134 may also be formed on tops of the barrier layer 126 but not on tops of the first dielectric material 128.

For example, any of polystyrene, phosphonic acids, thiols, benzotriazole, some Si—O—C—H monolayer, or the like may be deposited over the substrate 102 and may react with the hard mask 120 (e.g., titanium nitride, some other metal nitride, or the like) to form the blocking layer 134 on tops of the hard mask 120 but may not react with the first dielectric material 128 (e.g., silicon dioxide, silicon oxycarbide, some Si—O—C—H composite film, or the like) such that the blocking layer 134 is not formed on tops of the dielectric structures 132.

Alternatively, in some embodiments, the blocking layer 134 may be formed over the hard mask 120 and the dielectric structures 132. The blocking layer 134 may then be patterned to remove the blocking layer 134 from tops of the dielectric structures 132. The patterning may comprise a wet etching process or a dry etching process.

Figure 15:
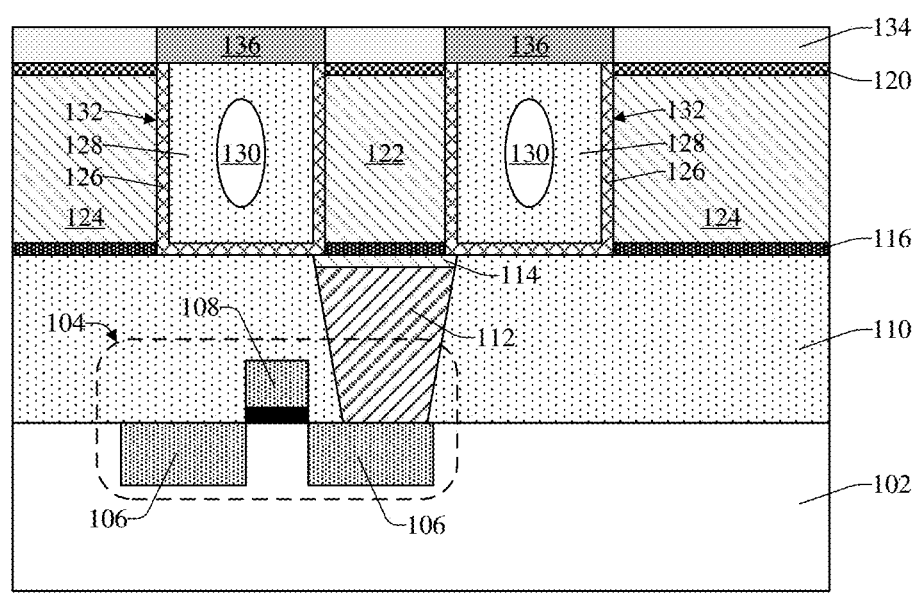

As shown in cross-sectional view 1500 of FIG. 15, a second dielectric material may be deposited over the dielectric structures 132 in the spacings between sidewalls of the blocking layer 134 to form a pair of protective etch-stop structures 136. The second dielectric material may be deposited by CVD, PVD, ALD, a spin-on process, or the like. The second dielectric material may be selectively deposited over the dielectric structures 132 and not on the blocking layer 134 due to the SAMs blocking the formation of the second dielectric material thereon. The second dielectric material may comprise, for example, silicon oxide, aluminum oxide, some other metal oxide, some metal nitride, or the like.

Figure 16:
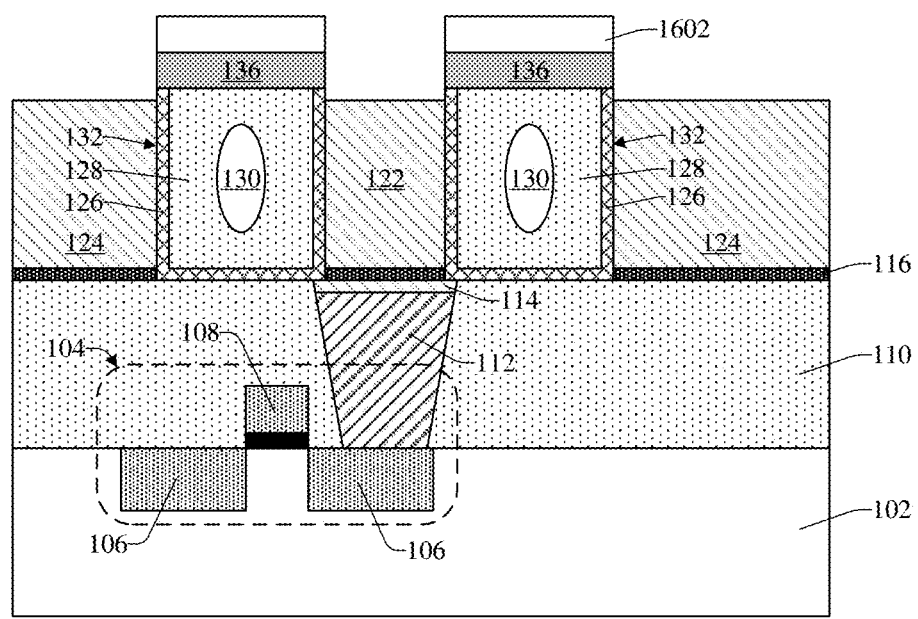

As shown in cross-sectional view 1600 of FIG. 16, a photoresist mask 1602 may be formed over tops of the protective etch-stop structures 136 but not over the blocking layer 134 nor the hard mask 120. The blocking layer 134 and the hard mask 120 may then be removed with the photoresist mask 1602 in place. The removal may comprise a wet etching process or a dry etching process. The photoresist mask 1602 may be removed after the etching process. Alternatively, in some embodiments, the blocking layer 134 and the hard mask 120 may be removed by a heating process or the like.

Figure 17:
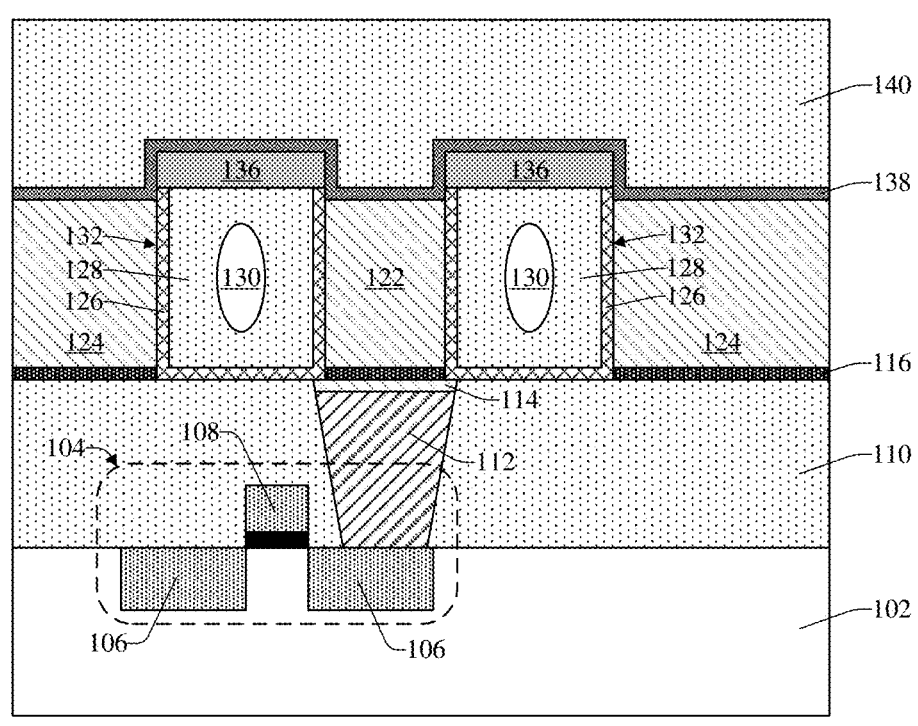

As shown in cross-sectional view 1700 of FIG. 17, an etch-stop layer 138 may be conformally formed over tops of the protective etch-stop structures 136, along sidewalls of the protective etch-stop structures 136, over a top of the first metal line 122, and over tops of the second metal lines 124. For example, the etch-stop layer 138 may be formed by depositing a dielectric material by CVD, PVD, ALD, or the like. The etch-stop layer 138 may also extend along sidewalls of the barrier layer 126. The etch-stop layer 138 may comprise, for example, aluminum nitride, aluminum oxide, or the like. In addition, an ILD layer 140 may be conformally formed over the etch-stop layer 138 by depositing a dielectric material by CVD, PVD, ALD, a spin-on process, or the like. The ILD layer 140 may comprise, for example, silicon dioxide, silicon oxycarbide, some Si—O—C—H composite film, or the like.

Figure 18:
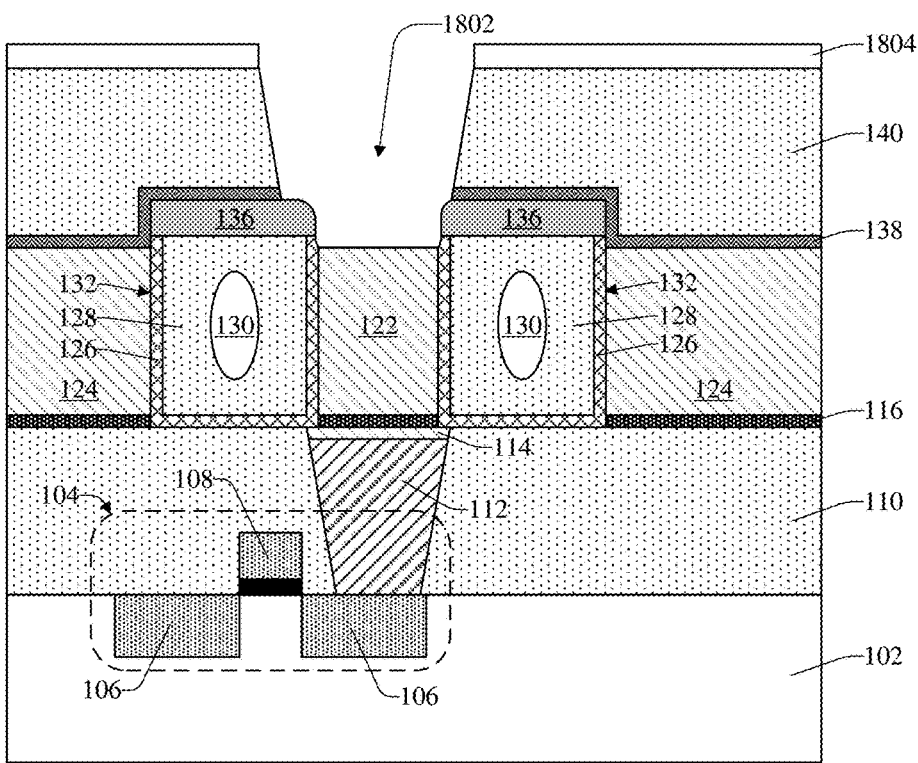

As shown in cross-sectional view 1800 of FIG. 18, a photoresist mask 1804 may be formed over a top of the ILD layer 140. The ILD layer 140 may then be patterned with the photoresist mask 1804 in place to form a via opening 1802. The via opening 1802 may extend through the ILD layer 140 to tops of the protective etch-stop structures 136 and to a top of the first metal line 122. The patterning may comprise a wet etching process or a dry etching process. The photoresist mask 1804 may be removed after the etching process.

In some embodiments, the etching may remove portions of the ILD layer 140 but not the underlying protective etch-stop structures 136 due to a etch rate of the ILD layer 140 being substantially higher than an etch rate of the protective etch-stop structures 136 during the etch. As a result, the etch may extend through the ILD layer 140 to a top of the first metal line 122 but may not extend through the protective etch-stops structures 136 to the dielectric structures 132. Thus, the protective etch-stop structures 136 may protect to the dielectric structures 132 from the etch, which may prevent a via (e.g., 142) from extending into the dielectric structures 132 toward the second metal lines 124 during the formation of the via (See, e.g., FIG. 19). As a result, a distance between the via (e.g., 142) and the electrically isolated pair of second metal lines 124 may be maintained, thereby preventing undesirable shorts or leakage currents from occurring between the via (e.g., 142) and the second metal lines 124. Thus, the reliability of the integrated chip may be improved.

Figure 19:
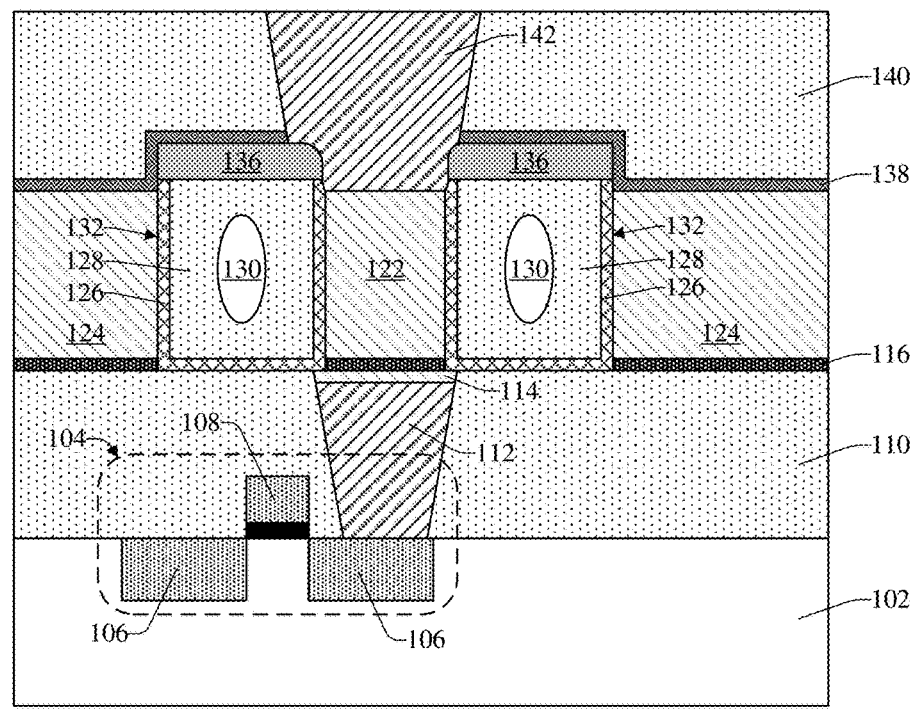

As shown in cross-sectional view 1900 of FIG. 19, a second metal material may be deposited in the via opening 1802 to form a via 142. The second metal material may be deposited by a sputtering process, an electroplating process, another suitable deposition process, or any combination of the foregoing. The second metal material may comprise, for example, copper, tungsten, titanium, or the like. As discussed above, the via 142 may not extend into the dielectric structures 132 due to the protective etch-stop structures 136 and thus, a reliability of the integrated chip may be improved.

FIG. 20 illustrates a flow diagram of some embodiments of a method 2000 of forming an interconnect structure comprising a pair of protective etch-stop structures. While method 2000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2002, a dielectric layer may be formed over a substrate. FIG. 7 illustrates a cross-sectional view 700 of some embodiments corresponding to act 2002.

At 2004, a contact may be formed in the dielectric layer. FIG. 9 illustrates a cross-sectional view 900 of some embodiments corresponding to act 2004.

At 2006, a first metal material may be deposited over the dielectric layer and a hard mask may be formed over the first metal material. FIG. 10 illustrates a cross-sectional view 1000 of some embodiments corresponding to act 2006.

At 2008, the hard mask and the first metal material may be patterned to form openings in the first metal material between a first metal line and a pair of second metal lines. FIG. 11 illustrates a cross-sectional view 1100 of some embodiments corresponding to act 2008.

At 2010, a first dielectric material may be deposited in the openings to form a pair of dielectric structures with cavities disposed therein. FIG. 12 illustrates a cross-sectional view 1200 of some embodiments corresponding to act 2010.

At 2012, a blocking layer may be formed over the first metal line and the pair of second metal lines but not over the dielectric structures. FIG. 14 illustrates a cross-sectional view 1400 of some embodiments corresponding to act 2012.

At 2014, a second dielectric material may be deposited directly over the dielectric structures and between sidewalls of the blocking layer to form a pair of protective etch-stop structures. FIG. 15 illustrates a cross-sectional view 1500 of some embodiments corresponding to act 2014.

At 2016, the blocking layer and the hard mask may be removed from tops of the first metal line and the second metal lines. FIG. 16 illustrates a cross-sectional view 1600 of some embodiments corresponding to act 2016.

At 2018, an interlayer dielectric layer may be formed over the protective etch-stop structures, over the first metal line, and over the second metal lines. FIG. 17 illustrates a cross-sectional view 1700 of some embodiments corresponding to act 2018.

At 2020, the interlayer dielectric layer may be patterned to form a via opening that may extend through the interlayer dielectric layer to a top of the first metal line. FIG. 18 illustrates a cross-sectional view 1800 of some embodiments corresponding to act 2020.

At 2022, a metal may be deposited in the via opening to form a via. FIG. 19 illustrates a cross-sectional view 1900 of some embodiments corresponding to act 2022.

Thus, various embodiments of the present disclosure are directed towards an integrated chip having an interconnect structure, the interconnect structure comprising a pair of protective etch-stop structures for improving the reliability of the integrated chip.

Accordingly, in some embodiments, the present disclosure relates to an integrated chip. The integrated chip may comprise a first metal line disposed over a substrate at a first height. A via may be disposed over the substrate at a second height greater than the first height. The via may be disposed directly over a top of the first metal line and the via may comprise a first lower surface and a second lower surface above the first lower surface. A first dielectric structure may be laterally adjacent to the first metal line and may be disposed along a sidewall of the first metal line. The first dielectric structure may comprise a first dielectric material and a cavity. The cavity may comprise a gas. A first protective etch-stop structure may be disposed over the substrate at a third height that is less than the second height and greater than the first height. The first protective etch-stop structure may comprise a second dielectric material different from the first dielectric material. The first protective etch-stop structure may be disposed directly over a top of the first dielectric structure and the first protective etch-stop structure may vertically separate the second lower surface of the via from the top of the first dielectric structure.

In other embodiments, the present disclosure relates to an interconnect structure comprising a semiconductor substrate. A first metal line may be disposed over the semiconductor substrate at a first height. A pair of second metal lines may be disposed over the semiconductor substrate at the first height and laterally spaced apart from the first metal line on opposite sides of the first metal line. A via may be disposed over the semiconductor substrate at a second height greater than the first height. The via may be disposed directly over a top of the first metal line and may extend between outer sidewalls of the first metal line. The via may comprise a first lower surface and a second lower surface above the first lower surface. A pair of dielectric structures may be disposed on opposite sides of the first metal line and may laterally separate the first metal line from the pair of second metal lines. Both of the dielectric structures may comprise a first dielectric material and a cavity within the dielectric structures. The cavity may comprise a gas. A pair of protective etch-stop structures may be disposed over the semiconductor substrate at a third height that is less than the second height and greater than the first height. The pair of protective etch-stop structures may comprise a second dielectric material different from the first dielectric material. The pair of protective etch-stop structures may be disposed directly over tops of the pair of dielectric structures. The second lower surface of the via may be disposed on a top of a first protective etch-stop structure of the pair of protective etch-stop structures. A sidewall of the via that connects the first lower surface to the second lower surface may be disposed along a sidewall of the first protective etch-stop structure.

In yet other embodiments, the present disclosure relates to a method for forming an interconnect structure. A first metal material may be deposited over a substrate. The first metal material may be patterned to form a first metal line over the substrate and a first opening adjacent to the first metal line. A first dielectric material may be deposited in the first opening to form a first dielectric structure and a cavity may exists within the first dielectric structure after depositing the first dielectric material. A blocking layer may be formed directly on a top of the first metal line. A second dielectric material different from the first dielectric material may be deposited on a top of the first dielectric structure to form a first protective etch-stop structure on the top of the first dielectric structure. The blocking layer may be removed from the top of the first metal line. An interlayer dielectric (ILD) layer may be formed over the first protective etch-stop structure and over the first metal line. The ILD layer may be patterned to form a second opening in the ILD layer directly over the first metal line and directly over the first protective etch-stop structure. Patterning the ILD layer may comprise etching the ILD layer with high selectivity relative to the first protective etch-stop structure. A second metal material may be deposited in the second opening to form a via in the second opening directly over the first metal line and directly over the first protective etch-stop structure. The via may be vertically separated from the first dielectric material by the first protective etch-stop structure after the second metal material is deposited.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
a conductive line over a substrate, wherein the conductive line has a first sidewall, a second sidewall, and a top surface extending from the first sidewall to the second sidewall;
a dielectric layer comprising a first dielectric beside the conductive line;
a conductive via over the conductive line and the dielectric layer; and
a protective layer comprising a second dielectric between a lower surface of the conductive via and an upper surface of the dielectric layer,
wherein a bottom surface of the conductive via covers the top surface of the conductive line from the first sidewall of the conductive line to the second sidewall of the conductive line.

2. The integrated chip of claim 1, wherein the conductive via extends from over the protective layer to below the protective layer.

3. The integrated chip of claim 1, wherein the protective layer covers the upper surface of the dielectric layer from a first sidewall of the dielectric layer to a second sidewall of the dielectric layer.

4. The integrated chip of claim 1, further comprising:

an upper dielectric layer over the protective layer and laterally beside the protective layer, wherein the conductive via extends through the upper dielectric layer to the conductive line.

5. The integrated chip of claim 4, further comprising:

an etch-stop layer extending between a lower surface of the upper dielectric layer and an upper surface of the protective layer, and extending between a sidewall of the upper dielectric layer and a sidewall of the protective layer.

6. The integrated chip of claim 1, wherein a cavity is within the dielectric layer, wherein the cavity is delimited by one or more surfaces of the dielectric layer, and wherein the protective layer is vertically spaced from the cavity with the dielectric layer therebetween.

7. The integrated chip of claim 1, further comprising:

a barrier layer between the dielectric layer and the conductive line and extending along a bottom surface of the dielectric layer, wherein a first sidewall of the barrier layer extends along the first sidewall of the conductive line and above the bottom surface of the conductive via, wherein a second sidewall of the barrier layer extends along the second sidewall of the conductive line and above the bottom surface of the conductive via, and wherein the bottom surface of the conductive via extends from the first sidewall of the barrier layer to the second sidewall of the barrier layer.

8. An integrated chip comprising:

a semiconductor substrate;

a first conductive line and a second conductive line laterally spaced over the semiconductor substrate;

a conductive via over the first conductive line and laterally spaced from the second conductive line;

a dielectric structure between the first conductive line and the second conductive line, the dielectric structure comprising a first dielectric; and a protective etch-stop structure over the dielectric structure and under the conductive via, the protective etch-stop structure comprising a second dielectric, different from the first dielectric, wherein a first lower surface of the conductive via extends along an upper surface of the protective etch-stop structure, a sidewall of the conductive via extends along a first sidewall of the protective etch-stop structure, and a second lower surface of the conductive via extends along an upper surface of the first conductive line.

9. The integrated chip of claim 8, wherein the conductive via extends along the first sidewall of the protective etch-stop structure from the upper surface of the protective etch-stop structure to below a lower surface of the protective etch-stop structure.

10. The integrated chip of claim 8, wherein the protective etch-stop structure is directly over the dielectric structure and directly between the conductive via and the dielectric structure.

11. The integrated chip of claim 8, wherein the sidewall of the conductive via extends along a sidewall of the dielectric structure below the first sidewall of the protective etch-stop structure.

12. The integrated chip of claim 8, further comprising:

a dielectric layer over the first conductive line and the protective etch-stop structure, wherein the conductive via is between sidewalls of the dielectric layer.

13. The integrated chip of claim 12, wherein a lower surface of the dielectric layer extends along the upper surface of the protective etch-stop structure, wherein a sidewall of the dielectric structure extends along a second sidewall of the protective etch-stop structure, and wherein the sidewall of the dielectric structure is directly over the second conductive line.

14. The integrated chip of claim 13, wherein the dielectric layer extends below a lower surface of the protective etch-stop structure.

15. An integrated chip comprising:

a conductive line over a substrate;

a dielectric structure comprising a first dielectric over the substrate and laterally adjacent to the conductive line and extending above a top surface of the conductive line;

a barrier layer along a bottom surface of the dielectric structure, along a sidewall of the dielectric structure, along a sidewall of the conductive line, and above the top surface of the conductive line;

a conductive via over the conductive line and the dielectric structure; and a protective etch-stop structure comprising a second dielectric, different than the first dielectric, over the dielectric structure, wherein a lower surface of the protective etch-stop structure is above a lower surface of the conductive via.

16. The integrated chip of claim 15, wherein the protective etch-stop structure is directly between a second lower surface of the conductive via and an upper surface of the dielectric structure.

17. The integrated chip of claim 15, further comprising:

a dielectric layer over the protective etch-stop structure, wherein an upper surface of the protective etch-stop structure is above a portion of a sidewall of the dielectric layer.

18. The integrated chip of claim 15, wherein the protective etch-stop structure is directly between a second lower surface of the conductive via and a top surface of the dielectric structure.

19. The integrated chip of claim 15, wherein the protective etch-stop structure is on a first top surface of the barrier layer, a second top surface of the barrier layer, and a top surface of the dielectric structure from the first top surface of the barrier layer to the second top surface of the barrier layer.

20. The integrated chip of claim 15, wherein the conductive via extends along a sidewall of the protective etch-stop structure and a sidewall of the barrier layer, and wherein the barrier layer is between a sidewall of the conductive via and the sidewall of the dielectric structure.

*    *    *    *    *